United States Patent
Li

(10) Patent No.: US 9,952,259 B2
(45) Date of Patent: Apr. 24, 2018

(54) INITIAL ANGLE DETECTION IN STAND STILL

(71) Applicant: Infineon Technologies AG, Neubiberg (DE)

(72) Inventor: Shi Nian Li, Beijing (CN)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/239,863

(22) Filed: Aug. 18, 2016

(65) Prior Publication Data

US 2017/0082419 A1 Mar. 23, 2017

(30) Foreign Application Priority Data

Sep. 22, 2015 (CN) .......................... 2015 1 0605596

(51) Int. Cl.
| | |
|---|---|
| G01N 27/00 | (2006.01) |
| G01R 19/00 | (2006.01) |
| G01B 7/30 | (2006.01) |
| H02P 1/04 | (2006.01) |
| G01R 19/165 | (2006.01) |
| G01R 19/04 | (2006.01) |
| H02P 6/185 | (2016.01) |
| H02P 6/20 | (2016.01) |

(Continued)

(52) U.S. Cl.
CPC ....... *G01R 19/16547* (2013.01); *G01R 19/04* (2013.01); *H02K 29/08* (2013.01); *H02P 6/16* (2013.01); *H02P 6/185* (2013.01); *H02P 6/20* (2013.01)

(58) Field of Classification Search
CPC ..... G01R 19/16547; G01R 19/04; H02P 6/16; H02P 6/185; H02P 6/20

USPC ................. 324/71.1, 76.11, 207.25, 207.12; 318/400.33

See application file for complete search history.

(56) References Cited

U.S. PATENT DOCUMENTS

| | | | |
|---|---|---|---|
| 6,172,498 B1* | 1/2001 | Schmidt ............... | G01D 5/2006 318/685 |
| 2014/0176129 A1* | 6/2014 | Si ......................... | G01D 5/245 324/207.25 |

* cited by examiner

*Primary Examiner* — Amy He
(74) *Attorney, Agent, or Firm* — Eschweiler & Potashnik, LLC

(57) ABSTRACT

An apparatus and method for determining initial rotor position in a stationary state of an electric machine. The apparatus and method for determining initial rotor position in a stationary state of an electric machine include: a power supply module being used for supplying power at least to a motor; a switch circuit being used for switching motor power supply modes, wherein each power supply mode corresponds to a different electrical angle; a feedback circuit detecting a motor winding current and generating a corresponding feedback signal to feed back to a controller; and the controller determining a rotor angle on the basis of currents passing through the motor in different power supply modes, wherein the controller performs the following operations: (a) weighting and then comparing fed-back current values of currents passing through the motor in different power supply modes; (b) based on a maximum current value and current values for two power supply modes before and after the power supply mode corresponding to the maximum current value, calculating a position angle $P_A$ corresponding to the position of the maximum current value by using a similar triangle approximation method.

15 Claims, 14 Drawing Sheets

(51) Int. Cl.
*H02K 29/08* (2006.01)
*H02P 6/16* (2016.01)

INITIAL ANGLE DETECTION IN STAND STILL

CROSS REFERENCE TO RELATED APPLICATION

This application claims priority to Chinese Patent Application number 201510605596.2 filed Sep. 22, 2015 and his hereby incorporated in its entirety.

FIELD

The present disclosure relates to an apparatus and method for determining initial rotor position in a stationary state of an electric machine.

BACKGROUND

Permanent magnet brushless electric machines BLDCM (brushless direct current motors) or PMSM (permanent magnet synchronous motors) have characteristics such as small volume, high power density, low noise and good mechanical properties, so are widely used in many fields, such as the motor vehicle industry. Since such electric machines have no brushes, rotor position information is very important for control performance, in other words, it is necessary to know the rotor angle when the electric machine is in a stationary state. An ordinary BLDCM or PMSM requires an angular position sensor to detect the position of the rotor, so as to control electric machine start-up. However, most angular position sensors are relatively expensive, so increase the cost of the electric machine, and in some scenarios are difficult to install. To save costs and increase system reliability, sensor-free control is now widely used for electric machine control. Electric machine control methods which do not make use of a position sensor have thus become a focus of current research. In electric machine control methods which do not make use of a position sensor, electric machine start-up is a key consideration, and presents difficulties. One of the reasons for this is that electric machine start-up involves the initial rotor angle of the electric machine, which is very difficult to determine accurately. Although some simple methods currently exist for determining the initial angle by running the electric machine (e.g. in the past, some methods relied upon turning the electric machine slightly to obtain the initial position), it is not permitted to do this in most situations. Therefore in many applications, it is necessary to obtain the rotor angle with the electric machine in a stationary state; in other words, the ability to detect the initial position of the electric machine rotor in a stationary state of the electric machine has become a real necessity. Some previous methods for determining rotor angle in a stationary state of the electric machine were either very complicated, or did not yield the position with high precision.

SUMMARY

An object of the present disclosure is to meet the above requirement. The present disclosure can determine the initial angular position of the electric machine rotor precisely by a simple method with the electric machine in a stationary state.

In the embodiments of the present disclosure, the initial angle of the rotor in a stationary state of the electric machine is determined on the basis of the relationship between rotor position and the current passing through the electric machine windings in a stationary state of the electric machine. To facilitate understanding of the present disclosure, a three-phase BLDC or PMSM is used as an example in the embodiments, but this is not a restriction; the present method is also applicable to multi-phase electric machines with more than three phases. To facilitate understanding of the present disclosure, some terms used in this text are first of all defined below. Power supply mode: in a switch circuit (as an example, this text uses a bridge-type switch circuit, which is also referred to in some texts as a converter), a state in which the upper bridge is conducting while the lower bridge is turned off is defined as 1, a state in which the lower bridge is conducting while the upper bridge is turned off is defined as 0, and a state in which the upper and lower bridges are both turned off is defined as X. On this basis, 12 power supply modes can be defined sequentially as (U phase V phase W phase): "011, 01X, 010, X10, 110, 1X0, 100, 10X, 101, X01, 001, 0X1". Voltage vector angle in this text: supposing that an electrical angle corresponding to a first voltage vector in a power supply mode is 0 degrees, then when a three-phase bridge operates in 12 switch modes, the electrical angles corresponding to the next modes are sequentially 30 degrees, 60 degrees, 90 degrees, . . . 330 degrees. If there are 6 switch vectors, the angles corresponding thereto are respectively 0 degrees, 60 degrees, 120 degrees . . . 300 degrees or 30 degrees, 90 degrees, 150 degrees . . . 330 degrees. This text uses the example of 12 voltage vectors, which is not a restriction; 6 voltage vectors are also suitable for the present method. "Rotor angle" refers to the angle of relative rotation between the rotor and stator; the position of the A phase electric machine winding is generally defined to be 0 degrees.

According to one aspect of the embodiments of the present disclosure, an apparatus for determining initial rotor position in a stationary state of an electric machine comprises:

a power supply module, for supplying power at least to the electric machine; a switch circuit (as an example, this text uses a bridge-type switch circuit, also referred to as a converter, and in some embodiments of the present disclosure a three-phase bridge for a three-phase electric machine is used as an example), for outputting multiple excitation signals to switch electric machine power supply modes, wherein each power supply mode corresponds to a different electrical angle; a feedback circuit, which detects an electric machine winding current and generates a corresponding feedback signal to feed back to a controller (for example, in some embodiments of the present disclosure the feedback circuit can be implemented in the form of an amplifier, but those skilled in the art should understand that other circuits, capable of measuring electric machine winding current and generating a corresponding feedback signal to be supplied to a controller, can likewise be applied to the present disclosure); and a controller, which determines a rotor angle on the basis of currents passing through the electric machine in different power supply modes, wherein the controller performs the following operations: (a) weighting and then comparing fed-back current values of currents passing through the electric machine in different power supply modes, so as to determine a maximum current value and a power supply mode corresponding thereto; (b) based on the maximum current value and current values for two or more power supply modes before and after the power supply mode corresponding to the maximum current value, calculating a position angle $P_A$ corresponding to the position of the maximum current value by using a similar triangle method.

In some embodiments, the two power supply modes may be a preceding power supply mode and a succeeding power supply mode which are adjacent to the power supply mode corresponding to the maximum current value, or may be a preceding power supply mode and a succeeding power supply mode which are symmetric with respect to the power supply mode corresponding to the maximum current value but not adjacent to the power supply mode corresponding to the maximum current value.

In some embodiments, four power supply modes may be used instead of two power supply modes, but this will increase the complexity of mathematical operations.

According to another aspect of some embodiments of the present disclosure, a method for determining initial rotor position in a stationary state of an electric machine comprises: supplying power to an electric machine; switching electric machine power supply modes by means of an excitation signal, wherein each power supply mode corresponds to a different electrical angle; detecting an electric machine winding current and generating a corresponding feedback signal; and determining a rotor angle on the basis of currents passing through the electric machine in different power supply modes, wherein the rotor angle is determined by means of the following operations: (a) weighting and then comparing fed-back current values of currents passing through the electric machine in different power supply modes; (b) based on a maximum current value and current values for two or more power supply modes before and after the power supply mode corresponding to the maximum current value, calculating a position angle $P_A$ corresponding to the position of the maximum current value by using a similar triangle method.

According to another aspect of some embodiments of the present disclosure, a method for determining initial rotor position in a stationary state of an electric machine comprises the following steps: (a) outputting an excitation signal so as to power a stationary electric machine in a power supply mode; (b) a controller obtaining a feedback signal indicating a current passing through the stationary electric machine; (c) repeating steps (a) and (b) N times, N being the number of modes in which power is supplied to the stationary electric machine; (d) calculating a maximum current value and current values for two or more power supply modes before and after the maximum current value; (e) using a similar triangle method to calculate an approximate angle at the maximum current value; (f) performing error compensation by a linearization method, so as to determine a precise angle at the maximum current value.

DETAILED DESCRIPTION

Figure 1:
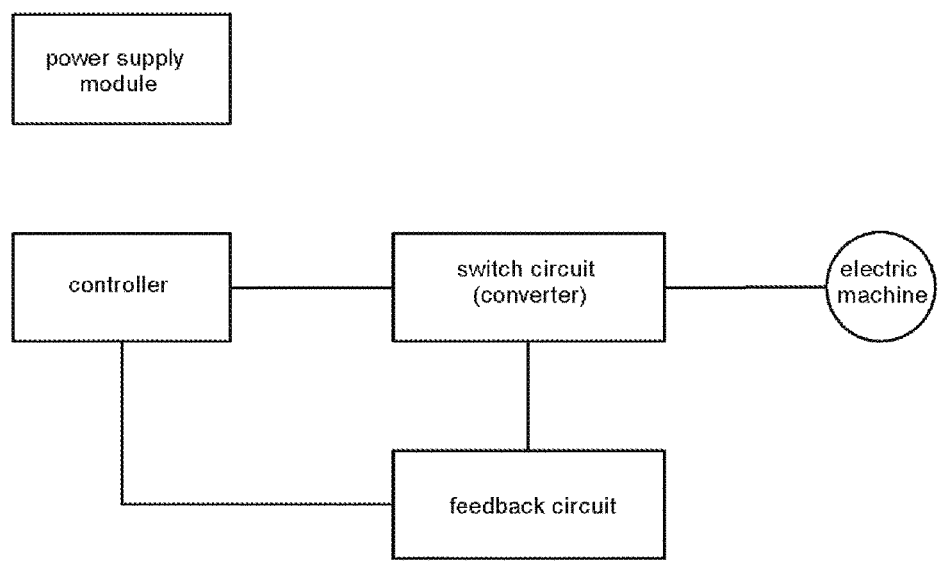
FIG. 1 shows a schematic diagram of an apparatus for determining the rotor angle in a stationary state of the electric machine according to an embodiment of the present disclosure.
Figure 2A:
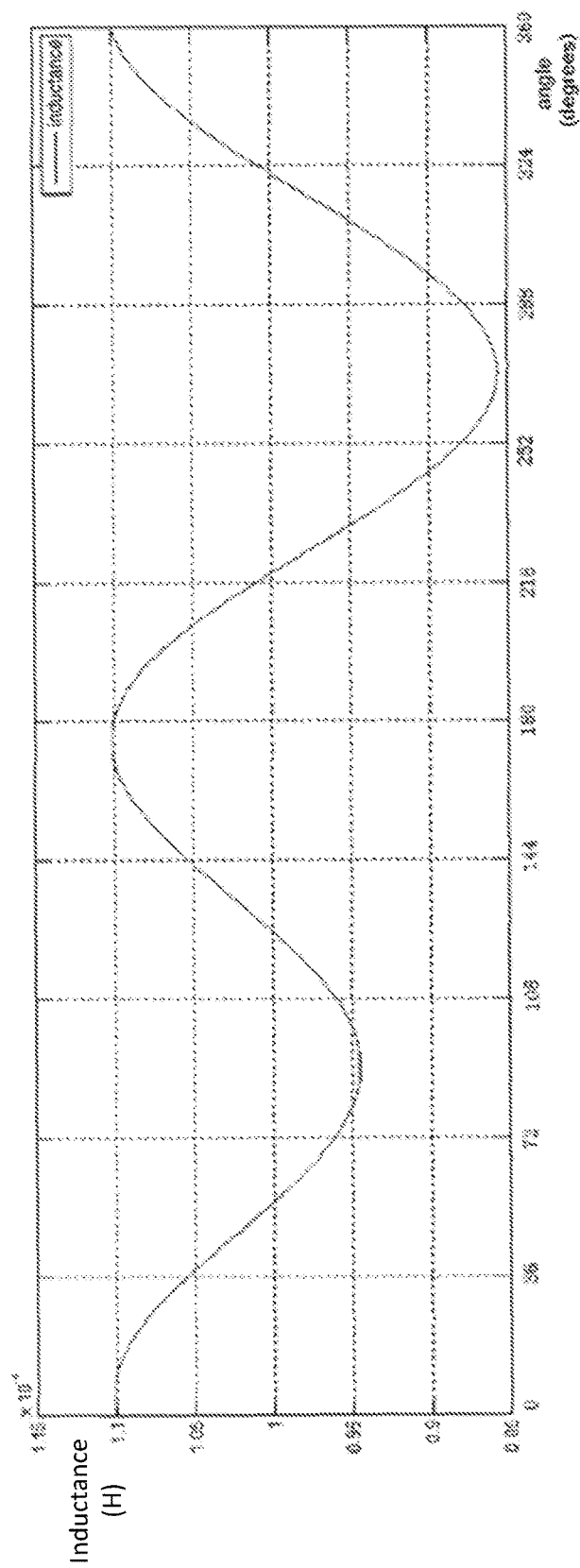
FIG. 2(A) shows the inductance distribution for different position angles when a current is passing through the electric machine winding.
Figure 2B:
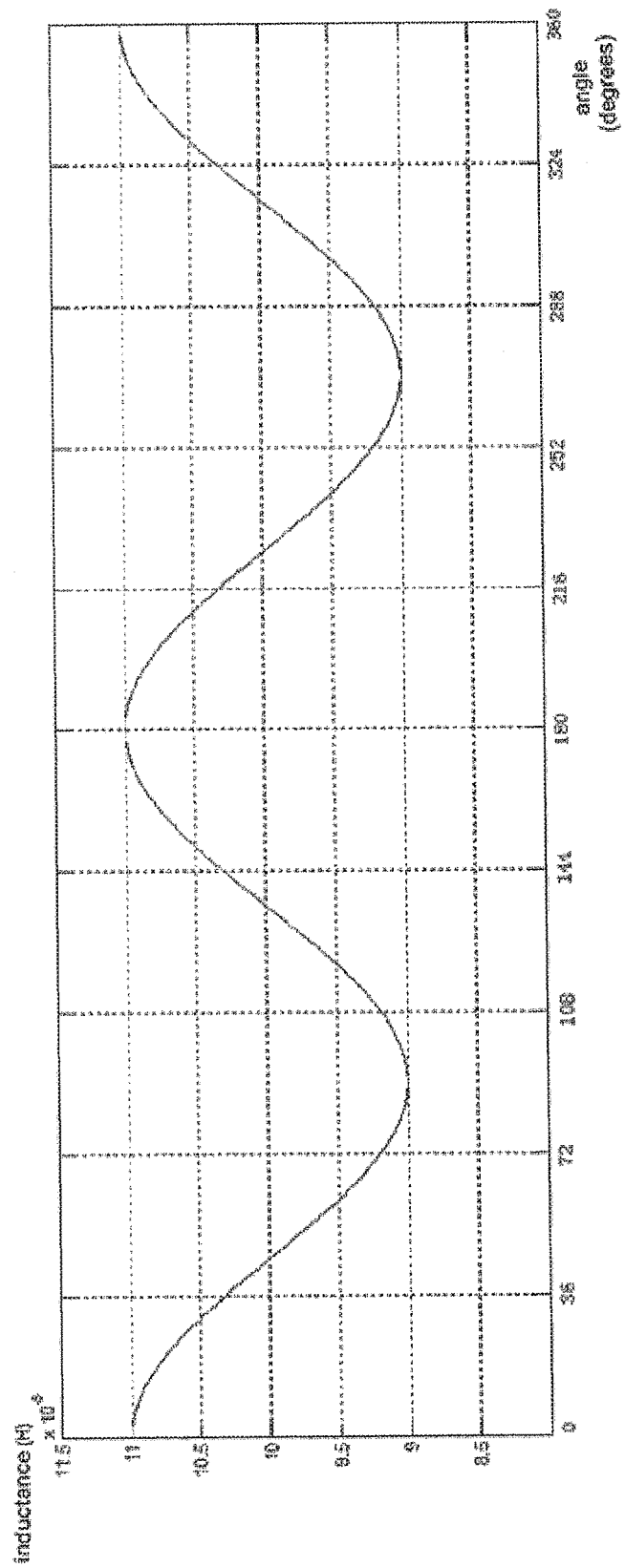
FIG. 2(B) shows the inductance distribution for different position angles when no current is passing through the electric machine winding.

FIG. 1 is a schematic diagram of an apparatus for determining the rotor angle of an electric machine according to an embodiment of the present disclosure. The electric machine (e.g. BLDC or PMSM) is formed of a rotor and a stator, wherein the rotor is generally formed of a permanent magnet, while the stator is formed of windings. If the PM flux zero crossing point is chosen as the initial position, then formula (1) can be used to approximately calculate the variation of electric machine winding inductance with position angle:

$$L_k = L_{mk} + \Delta L_k \cos(2p\theta) - \epsilon I_k \sin(p\theta) \quad (1)$$

in formula (1), $L_{mk}$ is average inductance, $\Delta L_k$ is the maximum change in inductance caused by magnetic flux, $\epsilon$ is a coefficient of magnetic flux relative to current, $I_k$ is excitation current, and p is the number of pole pairs of the electric machine. Thus we can obtain the inductance distribution for different position angles when a current is passing through the electric machine winding as shown in FIG. 2(A) (the inductance distribution when p is 1, i.e. in one electrical period). FIG. 2(B) shows the inductance distribution for different position angles when no current is passing through the electric machine winding (the inductance distribution when p is 1, i.e. in one electrical period).

It can be seen from FIG. 2 that the electric machine winding inductance varies with angle, and the minimum value of inductance occurs at the position angle of 270 degrees. In other words, we can determine that the position where the inductance value is smallest is at 270 degrees by measuring the inductance value at different positions. However, in many scenarios it is very difficult to measure the inductance value directly; it must be determined indirectly using the current passing through the electric machine winding.

Figure 3:
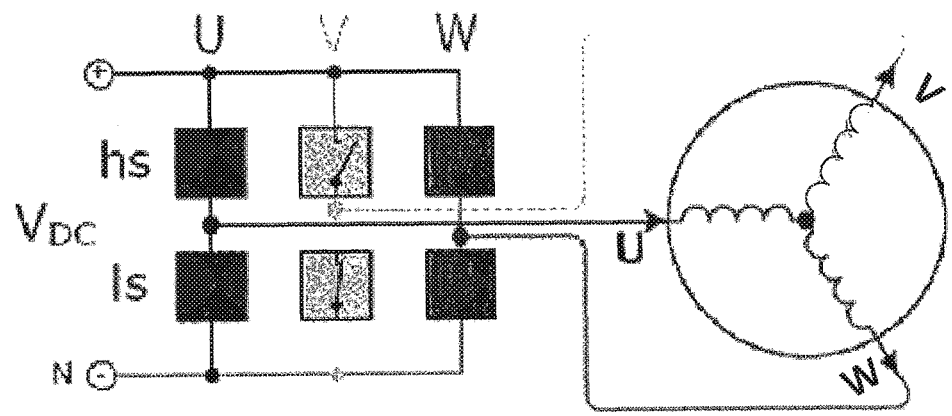
FIG. 3 shows a schematic diagram of a three-phase bridge for driving an electric machine according to an embodiment of the present disclosure.
Figure 4A:
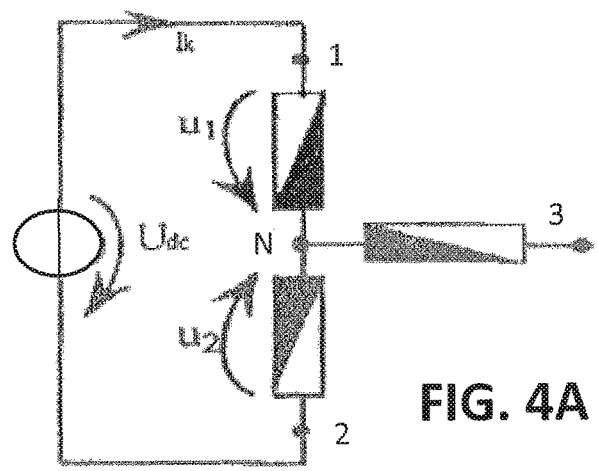
FIG. 4(A) and FIG. 4(B) show current paths in a two-phase power supply mode and a three-phase power supply mode, respectively.
Figure 4B:
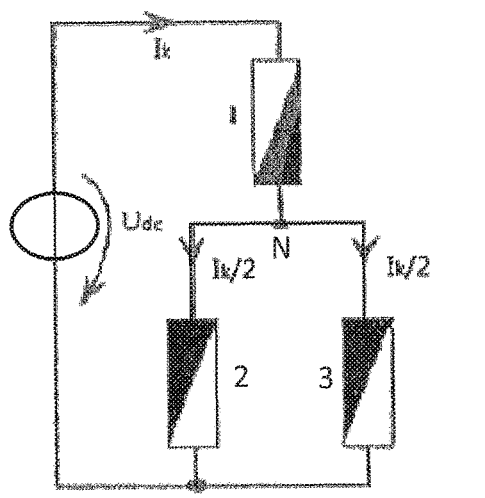

FIG. 3 shows a three-phase bridge for driving an electric machine according to an embodiment of the present disclosure. The three-phase bridge can form 12 switch modes, which are 011, 01X, 010, X10, 110, 1X0, 100, 10X, 101, X01, 001, 0X1 respectively (wherein 1 indicates that the upper half-bridge is in a conducting state, 0 indicates that the lower half-bridge is in a conducting state, and X indicates a state of non-use), and these modes correspond to different electrical angles, i.e. 0-30-60-90 . . . 330. Those skilled in the art should understand that the method and apparatus of the present disclosure are not limited to a three-phase bridge, for example the present method is also applicable to a six-phase bridge or a nine-phase bridge. It can be seen from FIG. 3 that there are two main current paths in different switch modes. In the first, power is supplied through two phases only as shown in FIG. 4(A), wherein the current flowing through the electric machine winding can be represented as (2a):

$$I_K(t) = \frac{V_{dc}}{1.5R}(1 - e^{-(R/L)t}) \quad (2a)$$

and in the second, power is supplied through three phases as shown in FIG. 4(B), wherein the current flowing through the electric machine winding is expressed as (2b):

$$I_K(t) = \frac{V_{dc}}{2R}(1 - e^{-(R/L)t}) \quad (2b)$$

Figure 5:
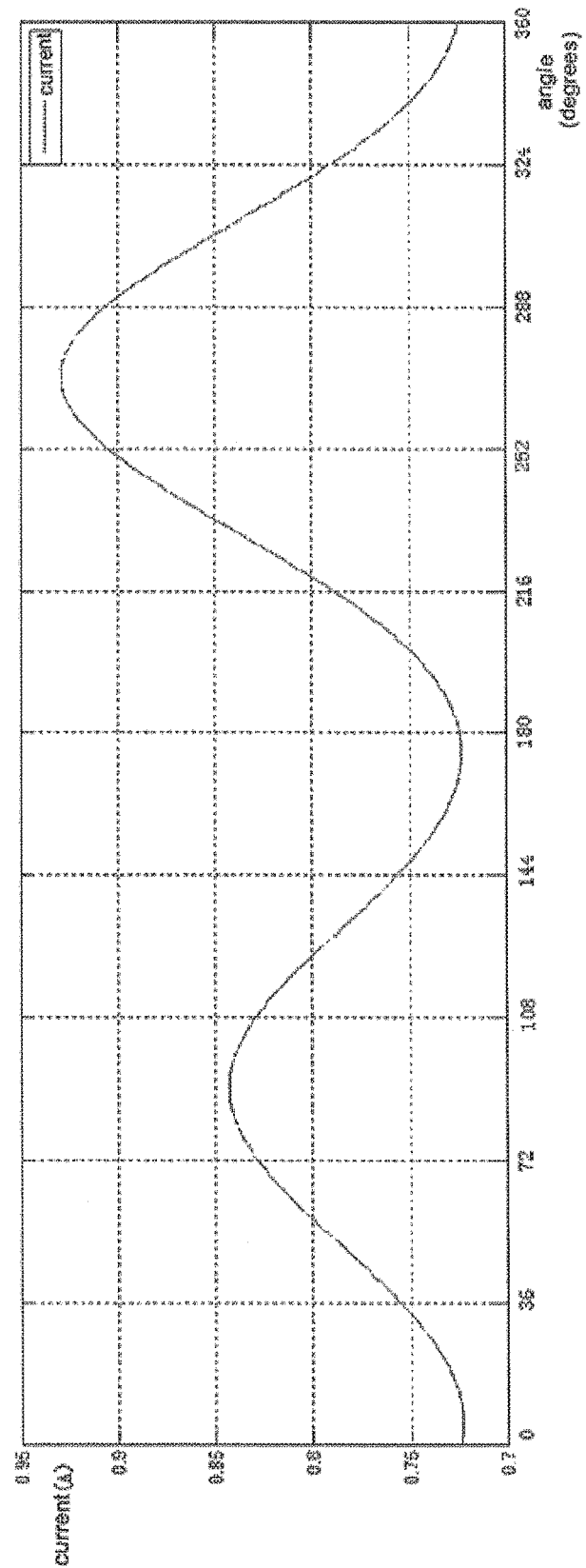
FIG. 5 shows the current distribution for different position angles in an electric machine after weighting of currents in different power supply modes, according to an embodiment of the present disclosure.

To facilitate comparison of current values in different switch modes in a unified manner, the current $I_K$ (t) in equality (2a) is multiplied by the coefficient 3/4 or the current $I_K$ (t) in equality (2b) is multiplied by the coefficient 4/3. Alternatively, the sampling time t can be changed, so as to achieve the same objective. After such processing, when a power supply module supplies power to the electric machine, the current passing through the electric machine winding can vary with position angle as shown in FIG. 5, wherein the maximum value of the current corresponds to a position angle of 270 degrees.

Figure 6:
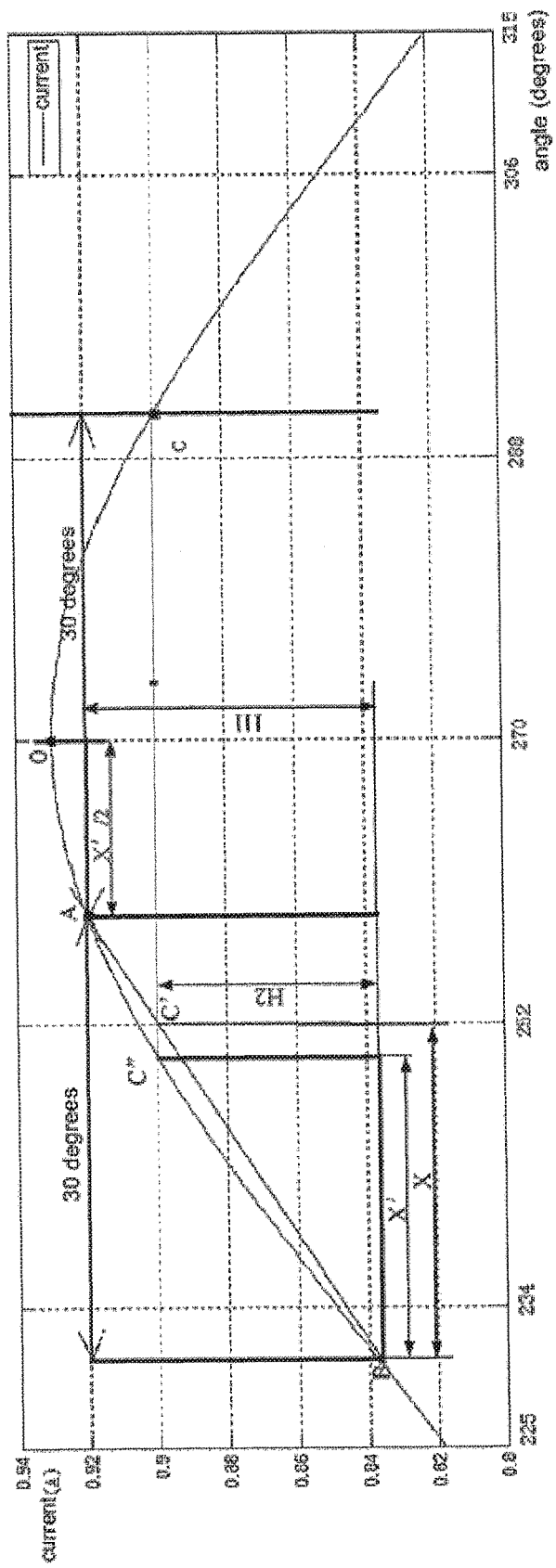
FIG. 6 shows a schematic diagram of a similar triangle method.
Figure 7:
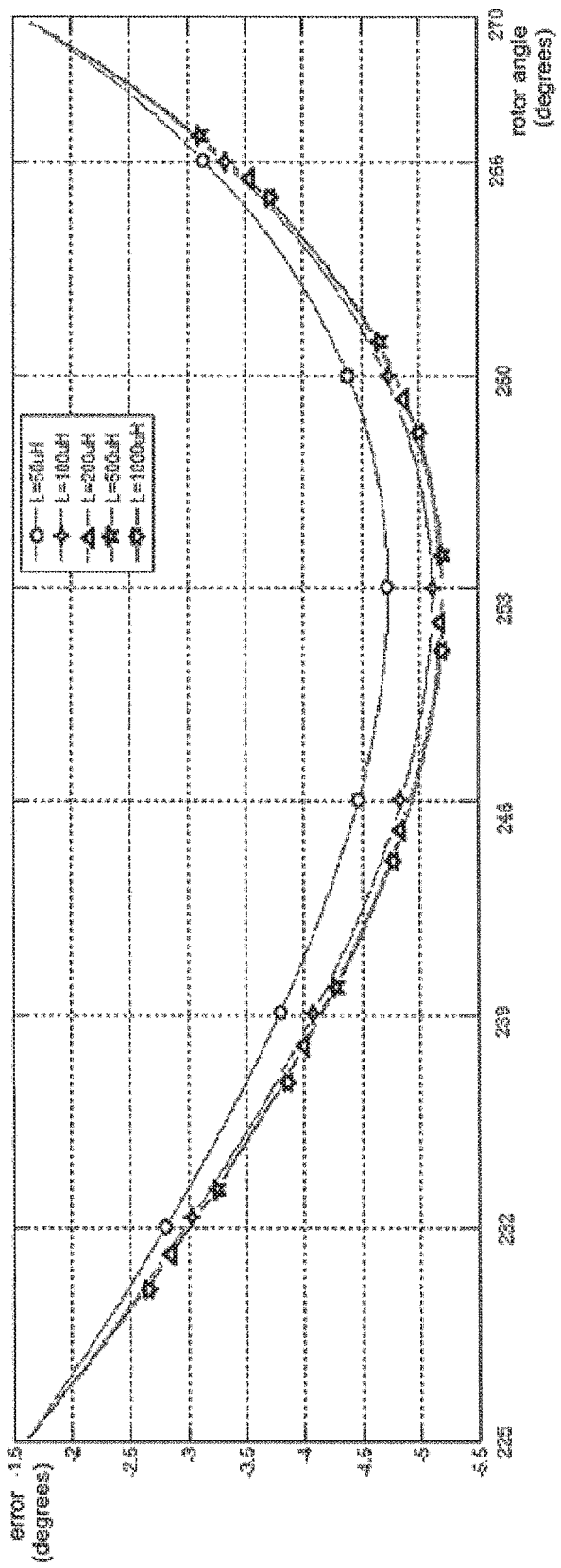
FIGS. 7-10 show curves of an error function ERROR=$P_A-\theta$ varying with angle for different electric machine parameters according to an embodiment of the present disclosure.
Figure 8:
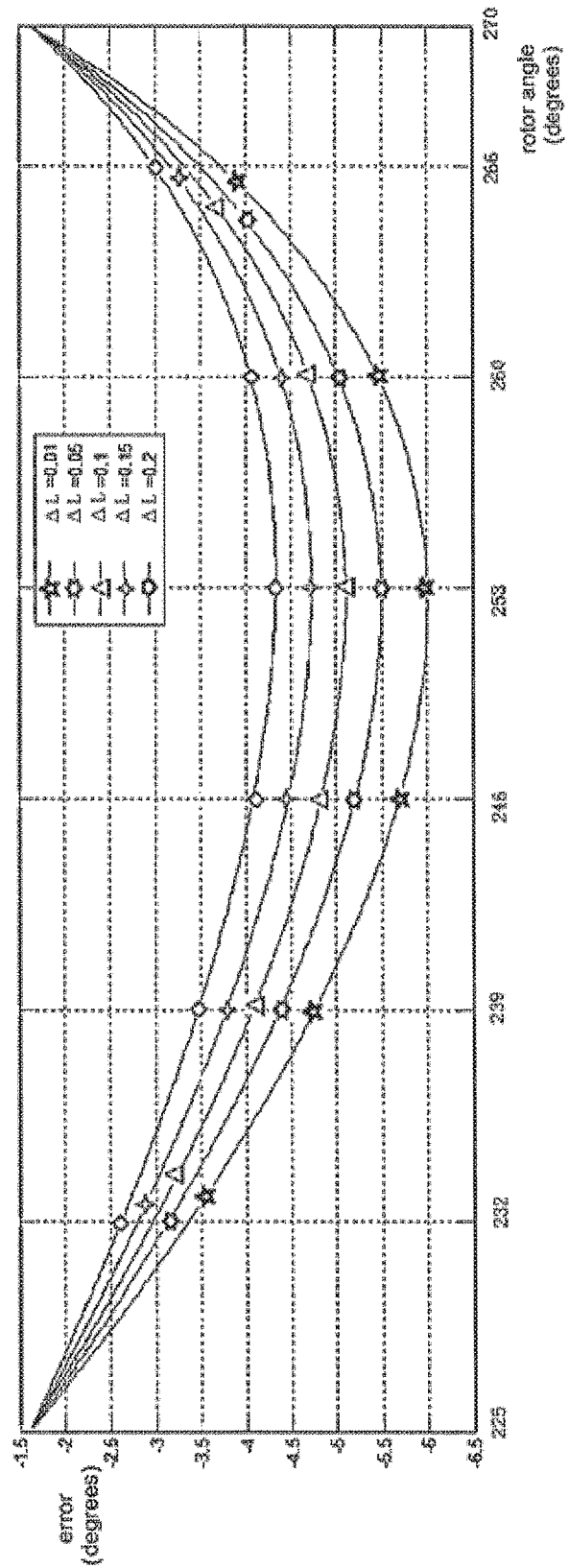
Figure 9:
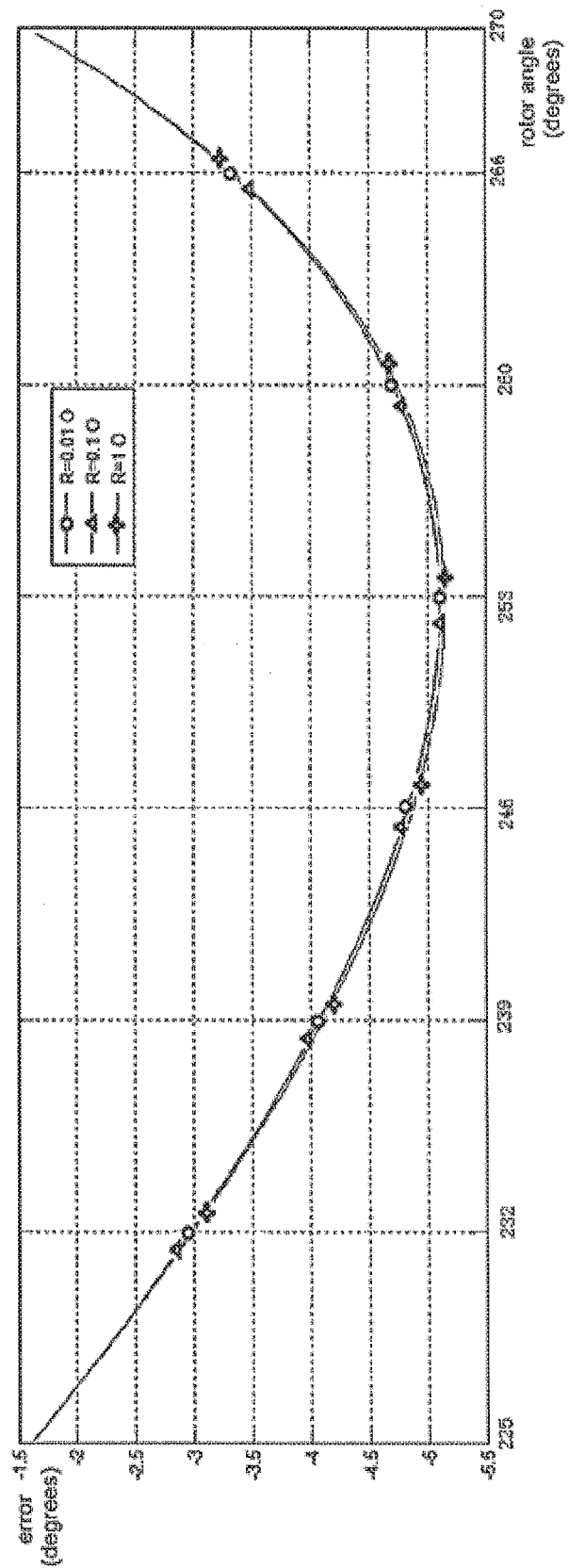
Figure 10:
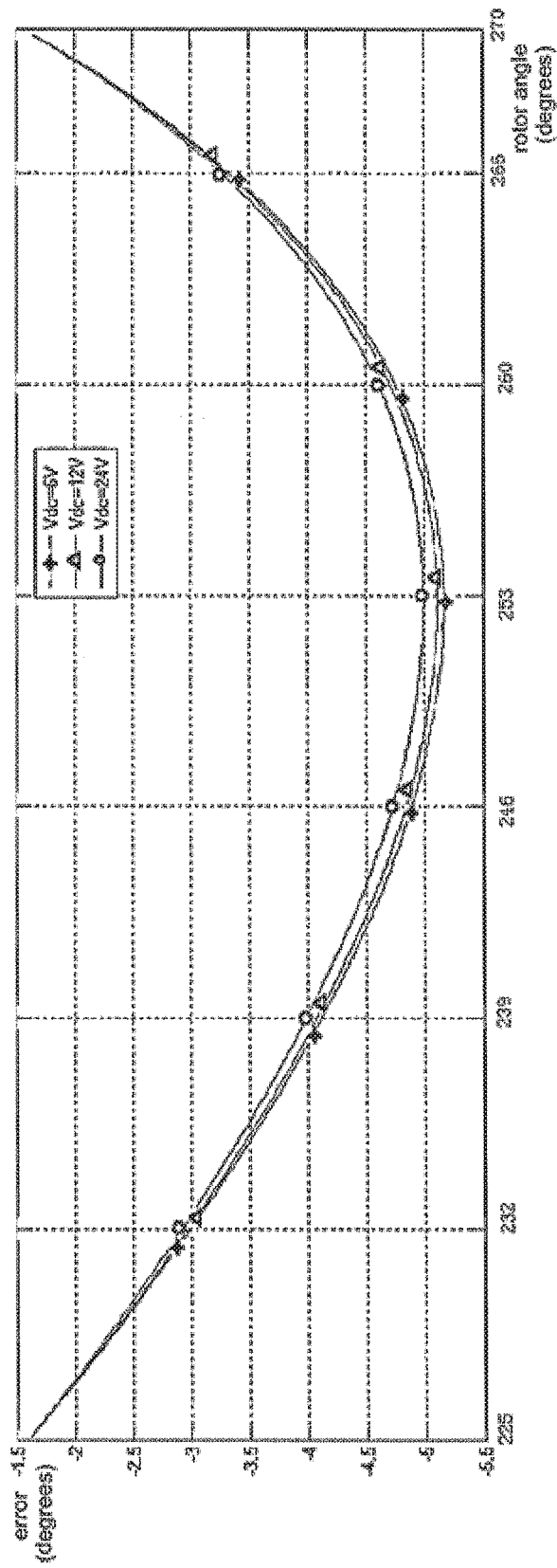

Based on the above analysis and conclusions, 12 voltage vectors (corresponding to 12 different electrical angles on a circumference) are now applied to the electric machine through the three-phase bridge, and 12 current values can be correspondingly detected, and once the current values have been subjected to corresponding weighting processing, the following can be obtained: one maximum value (e.g. point A in FIG. 6) and two adjacent values on two sides of the maximum value (e.g. points B and C in FIG. 6), as well as a point D on the left side of point B, and a point E on the right side of point C (for the sake of conciseness, points D and E are not drawn in FIG. 6). It can be seen from the current diagram over one electrical cycle shown in FIG. 5 that the current passing through the electric machine winding has a unique peak value, and this point corresponds to the position angle of 270 degrees. Once the electrical angle and power supply mode corresponding to the maximum current value at the position angle of 270 degrees are known, the initial rotor angle can be determined. For example, based on the above definitions, when the current value in the power supply mode corresponding to an electrical angle of 270 degrees is largest, the rotor angle is 0 degrees. However, as shown in FIG. 6, the point at which the feedback current actually measured is the maximum value is not always exactly at 270 degrees, but generally deviates from the position of 270 degrees to a greater or lesser extent. Moreover, when 12 power supply modes are used, since the interval between electrical angles is 30 degrees, the error range between point A of the maximum feedback current value and the peak value point O should be within +/−15 degrees.

To reduce the error, we can process the feedback current value, so as to determine the exact position angle of the point at which the feedback current has the maximum value. Referring to FIG. 6, 3 points A, B and C (corresponding to 3 voltage vectors) are always present in the vicinity of the position angle of 270 degrees (i.e. the position angle of the theoretical maximum current value). Although the middle point A might be displaced to the left or right relative to the position angle of 270 degrees, it is always the case that only three such points A, B and C are present within a range of 60 degrees in the vicinity of the position angle of 270 degrees. Thus, the actual position angle of point A can be calculated using these 3 feedback current values by means of a similar triangle method. Those skilled in the art should understand that in this text, the three points A, B and C are selected as an example to illustrate the similar triangle method of the present disclosure. In another embodiment, points B and C which are adjacent to point A need not necessarily be used to calculate the actual position angle of point A. For example, points D and E can be obtained (points D and E are not shown in FIG. 6), wherein point D is a point (corresponding to another voltage vector) located on the left side of point B, and point E is a point (corresponding to another voltage vector) located on the right side of point C. The actual position angle of point A can likewise be calculated using feedback current values of points ADE by means of a similar triangle algorithm. In another embodiment, the four points D, B, A, C and E can be used to calculate the actual position angle of point A.

The peak O of the curve in FIG. 6 is theoretically 270 degrees, and has the theoretical maximum feedback current; A is the point corresponding to the maximum current passing through the electric machine when 12 voltage vectors are applied; B is a point before A; C is a point after A; C" is a symmetrical point of C. A and B are connected, C and C" are connected; the point of intersection is C'. The angular phase between B and C' is X; the angular phase between B and C" is X'. The angular phase between A and O is X'/2. Since C' and C" are nearby points, we use x to approximate X'. Since the angle of point O is known, the position of A should be 270−X'/2. Supposing that the current difference between A and B is H1, and the current difference between B and C' (or C") is H2, then we can calculate X, for example X=30*H2/H1. Next, the position angle of A can be approximated according to the following formula:

If point A is on the left side of point O (C has a value larger than B), then $P_A = 270 - 30*(H2/H1)$.

If point A is on the right side of point O (B has a value larger than C), then the formula is as follows: $P_A = 270 + 30*(H2/H1)$.

Generally, the position angle $P_A$ of point A that is obtained by approximate calculation is not the true position of point A(θ), but merely an approximate angle. In other words, there is always a certain error between the true position angle (θ) and $P_A$, and we define the error ERROR=$P_A$−θ. Since the feedback current is related to parameters in the electric machine, the error derived from the feedback current is also influenced by the electric machine parameters L, R, ΔL and Vdc, etc., wherein L is influenced by $L_{mk}$, $\Delta L_k$ and ε. FIGS. 7-10 depict the effect of changes to various different parameters on the error ERROR=$P_A$−θ, wherein the parameter values used are as follows:

DC bus voltage Vsup=12 V
electric machine phase resistance R=0.1 O M
electric machine phase inductance, average value Lavg=100e-6H
Variation ratio ΔL of phase inductance peak value relative to average value=0.1 Ip=1.

Figure 11:
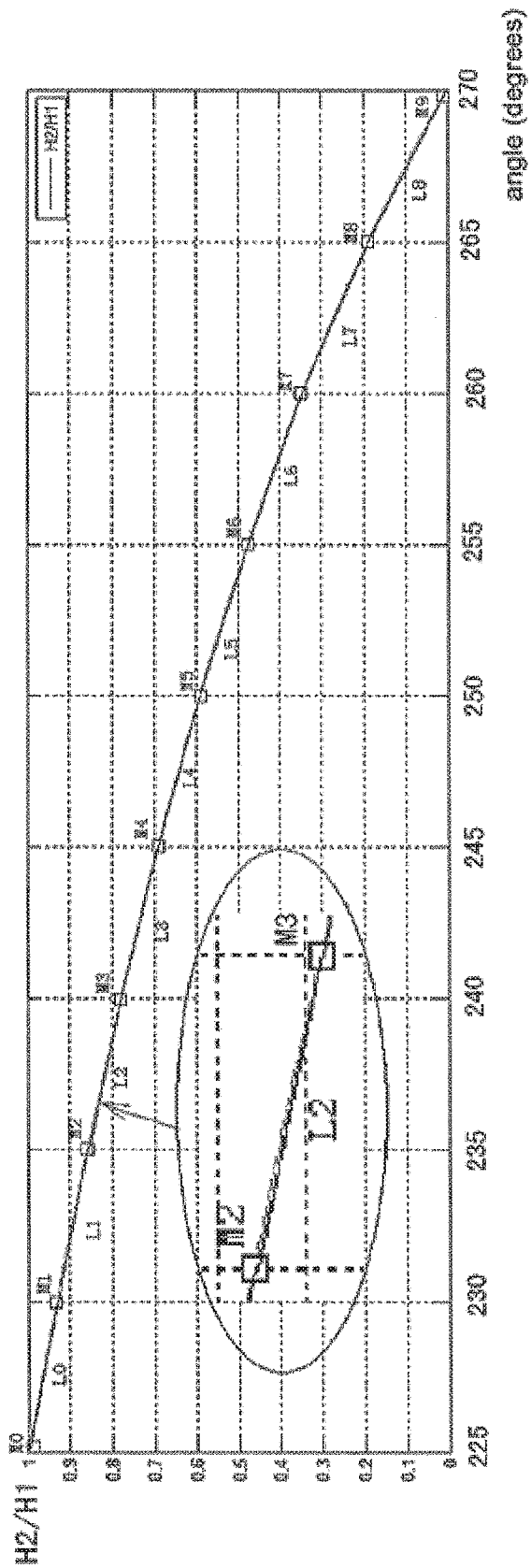
FIGS. 11-13 show schematic diagrams of error compensation by a piecewise linearization method according to an embodiment of the present disclosure.
Figure 12:
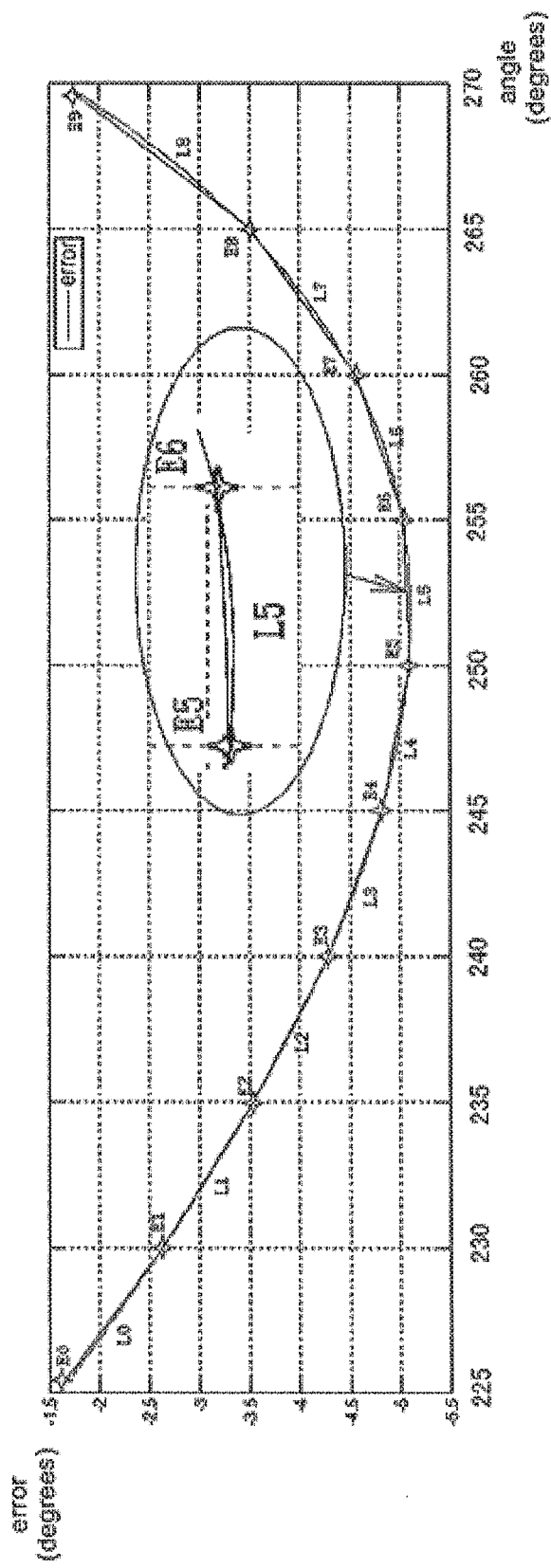
Figure 13:
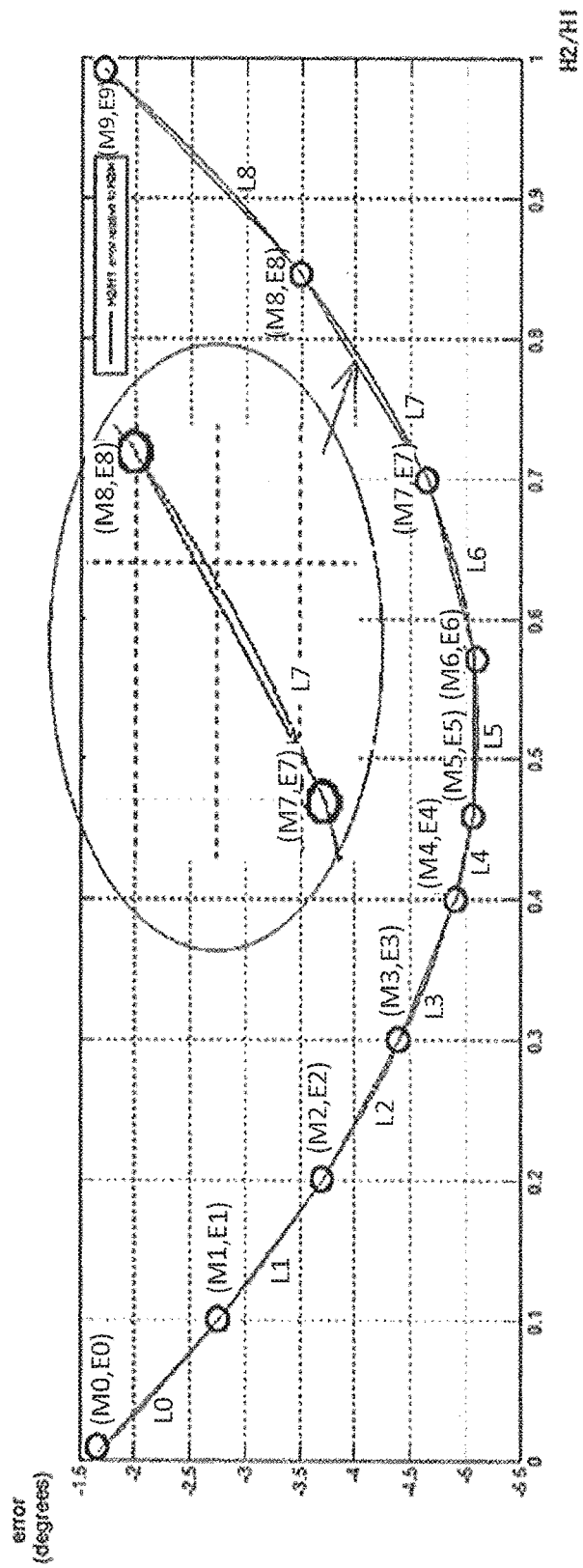

Based on FIGS. 7-10 it can be seen that the error in rotor angle is mainly affected by $\Delta L_k$, and is affected by other parameters very little, therefore we can subject ordinary small electric machines to generalized error compensation (because $\Delta L_k$ is generally within the range referred to in the figure). Of course, a user may also determine an error curve corresponding to the electric machine being used, and use the present method to obtain a good result. To perform error compensation, we need to establish a correspondence function relationship between (H2/H1) and the error ERROR. This can be achieved by subjecting an H2/H1 curve and an error curve to the same linearization by a linearization method (e.g. a function linearization method such as a Fourier series, or a piecewise linearization method). A piecewise linearization method is used as an embodiment here, i.e. a linear relationship between the error ERROR and H2/H1 can be determined by means of an approximate linear relationship between H2/H1 and angle (θ). Referring to FIG. 11, since the H2/H1 curve approximately forms a line, a smaller number of segments (such as N=9) can be used. As shown in FIG. 11, as an example, first of all the H2/H1 curve is divided into 9 segments, wherein each node is defined as $M_i (0 \le i \le N)$. In FIG. 12, the error ERROR is likewise divided into 9 segments, wherein each node value is defined as $E_i (0 \le i \le N)$. Then each segment of H2/H1 and the error ERROR is approximated to a straight line, and the straight line of each segment is named $L_k$ ($0 \le k \le N-1$). The straight line formula of each segment is (as shown in FIG. 13, the horizontal axis represents H2/H1, while the vertical axis represents the error ERROR, i.e. the error ERROR is taken to be a function of H2/H1):

$$y - E_i = \frac{E_{i+1} - E_i}{M_{i+1} - M_i}(x - M_i) \quad (3)$$

Thus, the angular error compensation for segment $L_i$ is:

$$f_i = \frac{E_{i+1} - E_i}{M_{i+1} - M_i}(x - M_i) + E_i \quad (4)$$

A piecewise function relationship between angular error compensation and H2/H1 is established below, i.e. the angular error compensation CPS is taken to be a piecewise function of (H2/H1). Thus, for different $L_k$ ($0 \le k \le N-1$), the following equality (5) can be obtained:

$$CPS = \begin{cases} f_0 & \text{for } L0 \\ f_1 & \text{for } L1 \\ \ldots \\ f_8 & \text{for } L8 \end{cases} \quad (5)$$

$f_i$ in equality (5) is a linear function, so we can use equality (5) to subject the error to compensation, i.e.

$$error0 = \begin{cases} error + f_0 & \text{for } L0 \\ error + f_1 & \text{for } L1 \\ \ldots \\ error + f_8 & \text{for } L8 \end{cases} \quad (6)$$

The error yielded by subjecting the error ERROR to compensation according to equality (6) is ERROR0. ERROR0 will be much smaller than ERROR.

Figure 14:
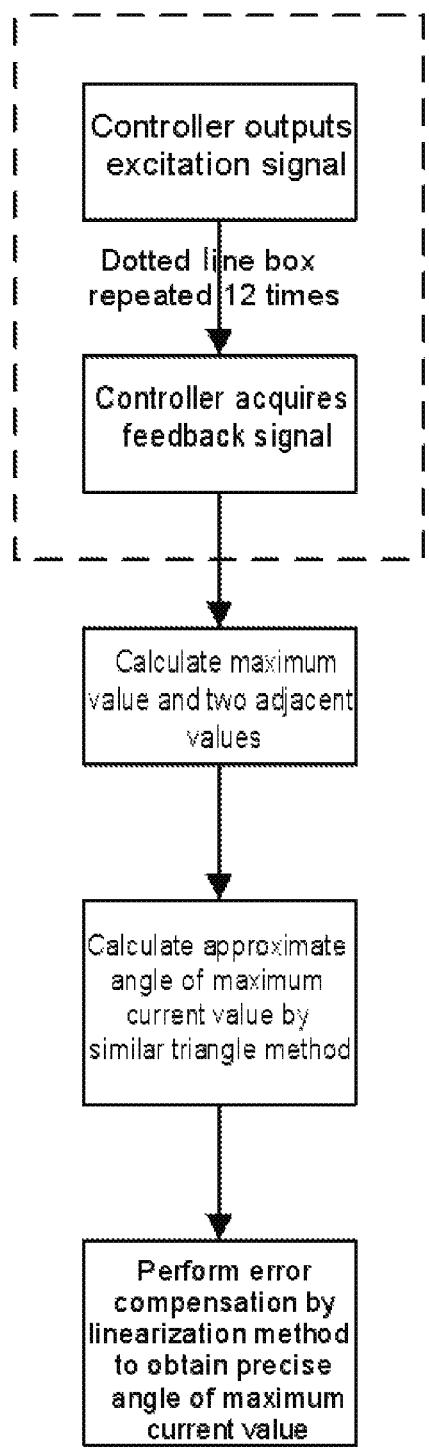
FIG. 14 shows a flow chart of a method for determining the initial position of the rotor in a stationary state of the electric machine according to an embodiment of the present disclosure.

According to an embodiment of the present disclosure, FIG. 14 shows a flow chart of a method for determining the initial position of the rotor in a stationary state of the electric machine. The steps of this exemplary embodiment are as follows: (1) a controller outputs an excitation signal, i.e. the controller controls a switch circuit (converter) to apply an excitation signal for a first power supply mode to a stationary electric machine; (2) the controller obtains a feedback signal from a feedback circuit, i.e. the feedback circuit feeds the detected value of a current passing through the electric machine in the stationary state in the first power supply mode back to the controller; (3) steps (1) and (2) are repeated 12 times according to 12 voltage vectors so as to obtain 12 corresponding current values, i.e. merely as an example, in the case where 12 power supply modes are used, the values of the currents passing through the stationary electric machine in different power supply modes are separately fed back to the controller, but those skilled in the art should understand that when a different number of power supply modes are used, the number of times step (3) is repeated will be different; (4) a maximum value and adjacent values are calculated from the 12 current values, i.e. as an example, in the case where 12 power supply modes are used, the maximum current value and the power supply mode corresponding thereto are determined by comparing the current values fed back to the controller in different power supply modes, and at the same time current values in adjacent power supply modes before and after this power supply mode are determined; (5) a similar triangle method is applied to determine an approximate position angle of point A, i.e. once the maximum current value and adjacent values thereof have been determined, the approximate angle of point A in FIG. 6 is calculated using the abovementioned similar triangle method; (6) a linearization method is applied to subject the angle of point A to compensation, to make the calculated angle more accurate, i.e. as an example, first of all a linearization method as described herein is used to subject an H2/H1 curve and an error curve to the same piecewise linearization separately, so as to establish a piecewise linear function relationship between the error and H2/H1, then the established piecewise linear function relationship between the error and H2/H1 is used to subject the error at a particular value of H2/H1 to compensation, so as to determine a more accurate position of point A. With the method shown in FIG. 14, we do not need any electric machine information, but can obtain a relatively accurate initial angle by means of feedback currents alone. Moreover, when the present disclosure is implemented, the complexity of calculation is low.

Although the present disclosure has described specific embodiments and general associated methods, changes to and replacements for these embodiments and methods will be obvious to those skilled in the art. Thus, the abovementioned description of exemplary embodiments does not define or restrict the present disclosure. Other changes, substitutions and alterations are also possible, as long as they do not depart from the spirit and scope of the present disclosure, as defined in the following claims.

The invention claimed is:

1. An apparatus for determining initial rotor position in a stationary state of an electric machine, comprising:
 a power supply module, for supplying power at least to the electric machine;
 a switch circuit, for switching electric machine power supply modes, wherein each power supply mode corresponds to a different electrical angle;
 a feedback circuit, which detects an electric machine winding current and generates a corresponding feedback signal to feed back to a controller; and
 a controller, which determines a rotor angle on the basis of currents passing through the electric machine in different power supply modes, wherein the controller performs the following operations:
- (a) weighting and then comparing fed-back current values of currents passing through the electric machine in different power supply modes, so as to determine a maximum current value and a power supply mode corresponding thereto;
- (b) based on the maximum current value and current values for two or more power supply modes before and after the power supply mode corresponding to the maximum current value, calculating a position angle $P_A$ corresponding to the position of the maximum current value by using a similar triangle method.

2. The apparatus as claimed in claim 1, wherein the switch circuit is a three-phase bridge, and there are 12 power supply modes, which respectively correspond to 12 electrical angles which differ from one another by 30 degrees sequentially, i.e..

3. The apparatus as claimed in claim 2, wherein the step of weighting and then comparing current values of currents passing through the electric machine in different power supply modes comprises multiplying a monitored current value by the coefficient 4/3 in a two-phase power supply mode, or multiplying a monitored current value by the coefficient 3/4 in a three-phase power supply mode.

4. The apparatus as claimed in claim 1, wherein a similar triangle approximation method is performed as follows: if the maximum current value is defined as A, the calculated position angle corresponding to the position of the maximum current angle A is $P_A$, and B and C are current values for two power supply modes before and after and adjacent to the power supply mode corresponding to A respectively, then if B<C, then $P_A=270-30*(H2/H1)$, wherein H2=C−B; H1=A−B;

if B>C, then $P_A=270+30*(H2/H1)$, wherein H2=B−C; H1=A−C.

5. The apparatus as claimed in claim 4, wherein the controller also performs the following operation: (c) performing error compensation by a linearization method, so as to compensate an error in the position angle corresponding to the position of the maximum current value, wherein the linearization method is performed as follows:
- (c-1) dividing a curve of the value H2/H1 varying with angle into N segments, and linearizing each segment, and at the same time linearizing N corresponding segments of a curve of the error function ERROR=$P_A-\theta$ varying with angle;
- (c-2) after linearization, for each of the N segments, establishing a corresponding segment function relationship between the error function ERROR and the value H2/H1, wherein N is a natural number greater than 1, and $\theta$ is the actual position angle of the position of the maximum current value A.

6. The apparatus as claimed in claim 5, wherein error compensation is performed as follows:

for a specific value H2/H1, compensating the calculated position angle $P_A$ according to the correspondence function relationship between the error function ERROR and the value H2/H1.

7. The apparatus as claimed in claim 1, wherein the controller also performs the following operation: (c) performing error compensation by a linearization method, so as to compensate an error in the position angle corresponding to the position of the maximum current value.

8. A method for determining initial rotor position in a stationary state of an electric machine, comprising:

supplying power to the electric machine;

switching electric machine power supply modes by means of an excitation signal, wherein each power supply mode corresponds to a different electrical angle;

detecting an electric machine winding current and generating a corresponding feedback signal; and determining a rotor angle on the basis of currents passing through the electric machine in different power supply modes, wherein the rotor angle is determined by means of the following operations:
- (a) weighting and then comparing fed-back current values of currents passing through the electric machine in different power supply modes, so as to determine a maximum current value and a power supply mode corresponding thereto;
- (b) based on the maximum current value and current values for two or more power supply modes before and after the power supply mode corresponding to the maximum current value, calculating a position angle $P_A$ corresponding to the position of the maximum current value by using a similar triangle method.

9. The method as claimed in claim 8, wherein there are 12 power supply modes, which respectively correspond to 12 electrical angles which differ from one another by 30 degrees sequentially, i.e..

10. The method as claimed in claim 9, wherein the step of weighting and then comparing current values of currents passing through the stationary electric machine in different power supply modes comprises multiplying a monitored current value by the coefficient 4/3 in a two-phase power supply mode, or multiplying a monitored current value by the coefficient 3/4 in a three-phase power supply mode.

11. The method as claimed in claim 8, wherein a similar triangle approximation method is performed as follows: if the maximum current value is defined as A, the calculated position angle corresponding to the position of the maximum current angle A is $P_A$, and B and C are current values for two power supply modes before and after and adjacent to the power supply mode corresponding to A respectively, then if B<C, then $P_A=270-30*(H2/H1)$, wherein H2=C−B; H1=A−B;

if B>C, then $P_A=270+30*(H2/H1)$, wherein H2=B−C; H1=A−C.

12. The method as claimed in claim 11, wherein the step of determining the rotor angle also comprises the following operation: (c) performing error compensation by a linearization method, so as to compensate an error in the position angle corresponding to the position of the maximum current value, wherein the linearization method is performed as follows:
- (c-1) dividing a curve of the value H2/H1 varying with angle into N segments, and linearizing each segment, and at the same time linearizing N corresponding segments of a curve of the error function ERROR=$P_A-\theta$ varying with angle;
- (c-2) after linearization, for each of the N segments, establishing a corresponding segment function relationship between the error function ERROR and the value H2/H1, wherein N is a natural number greater than 1, and $\theta$ is the actual position angle of the position of the maximum current value A.

13. The method as claimed in claim 12, wherein error compensation is performed as follows:

for a specific value H2/H1, compensating the calculated position angle $P_A$ according to the correspondence function relationship between the error function ERROR and the value H2/H1.

14. The method as claimed in claim 8, wherein the step of determining the rotor angle also comprises the following operation: (c) performing error compensation by a linearization method, so as to compensate an error in the position angle corresponding to the position of the maximum current value.

15. A method for determining initial rotor position in a stationary electric machine, comprising the following steps:
(a) outputting an excitation signal, so as to power the stationary electric machine in a power supply mode;
(b) a controller obtaining a feedback signal indicating a current passing through the stationary electric machine;
(c) repeating steps (a) and (b) N times, N being the number of modes in which power is supplied to the stationary electric machine;
(d) calculating a maximum current value and current values for two or more power supply modes before and after the maximum current value;
(e) using a similar triangle method to calculate an approximate angle of the maximum current value;
(f) performing error compensation by a linearization method, so as to determine a precise angle of the maximum current value.

\* \* \* \* \*